(12) United States Patent
Krigovski et al.

(10) Patent No.: US 8,185,795 B1
(45) Date of Patent: May 22, 2012

(54) SIDE CHANNEL FOR FORWARD ERROR CORRECTION USED WITH LONG-HAUL IP LINKS

(75) Inventors: Louis Krigovski, Lexington, MA (US); Brett Niver, Grafton, MA (US); Ramprasad Shetty, Westborough, MA (US)

(73) Assignee: EMC Corporation, Hopkinton, MA (US)

( * ) Notice: Subject to any disclaimer, the term of this patent is extended or adjusted under 35 U.S.C. 154(b) by 964 days.

(21) Appl. No.: 12/215,430

(22) Filed: Jun. 27, 2008

(51) Int. Cl.
*H03M 13/00* (2006.01)
(52) U.S. Cl. ........................ 714/752; 714/751
(58) Field of Classification Search .............. 370/206, 370/389; 714/776, 712, 746, 752, 751
See application file for complete search history.

(56) References Cited

U.S. PATENT DOCUMENTS

| | | | |
|---|---|---|---|
| 5,206,939 A | | 4/1993 | Yanai et al. |
| 5,729,526 A | * | 3/1998 | Yoshida ................. 370/206 |
| 5,742,792 A | | 4/1998 | Yanai et al. |
| 5,778,394 A | | 7/1998 | Galtzur et al. |
| 5,845,147 A | | 12/1998 | Vishlitzky et al. |
| 5,857,208 A | | 1/1999 | Ofek |
| 6,532,562 B1 | * | 3/2003 | Chou et al. ................. 714/776 |
| 6,948,104 B2 | * | 9/2005 | Herley et al. ............... 714/712 |
| 6,996,097 B1 | * | 2/2006 | Chou et al. ................. 370/389 |
| 7,162,676 B2 | * | 1/2007 | Coleman et al. ............ 714/752 |
| 7,366,172 B2 | * | 4/2008 | Chou et al. ................. 370/389 |
| 7,697,514 B2 | * | 4/2010 | Chou et al. ................. 370/389 |

FOREIGN PATENT DOCUMENTS

| | | |
|---|---|---|
| WO | WO 97/38549 | 10/1997 |
| WO | WO 01/95503 A1 | 12/2001 |

OTHER PUBLICATIONS

Feng, W., "Long-Haul TCP vs. Cascaded TCP," Technical Report TR-06-04, Computer Science, Virginia Tech, 2006, 5 pp.
Thompson, S., "Overcoming TCP/IP distance and BER limitations—Connectivity," Computer Technology Review, Nov. 2003, 4 pp.
Day, M., "High-Speed TCP eases WAN congestion," Network World, Oct. 3, 2005, <http://www.networkworld.com/news/tech/2005/100305techupdate.html>, 2 pp.

* cited by examiner

*Primary Examiner* — David Ton
(74) *Attorney, Agent, or Firm* — Muirhead and Saturnelli, LLC (57) ABSTRACT

A system for error correction processing includes methods, software and/or devices for generating and using correction packets that may provide for the rebuilding of a lost data packet or other information packet. A correction packet may be generated at a transmitting device that corresponds to a plurality of packets transmitted to a destination device. The correction packet may be transmitted to the destination device separately from the transmitting of the plurality of packets. The correction packet may be received at the destination device, and a determination may be made as to whether at least one of the plurality of packets transmitted to the destination device is a lost packet that has not been received at the destination device. If the lost packet of the plurality of packets is determined, the lost packet may be rebuilt using the correction packet.

22 Claims, 7 Drawing Sheets

SIDE CHANNEL FOR FORWARD ERROR CORRECTION USED WITH LONG-HAUL IP LINKS

TECHNICAL FIELD

This application is related to the field of data transmission and, more particularly, to error correction systems.

BACKGROUND OF THE INVENTION

For security and reliability, among other reasons, a company may maintain a remote backup data site to provide a data back-up and/or data mirroring facility in the event of loss of data at a primary site due to a disaster. In anticipation of the possibility of a catastrophic disaster, such as a natural disaster, it may be desirable to situate the remote backup site far from the primary site. An example of a storage system that may provide data backup and mirroring capability over a long distances is the Symmetrix Remote Data Facility (SRDF) products provided by EMC Corporation of Hopkinton, Mass. The SRDF system may be implemented using long haul networks that provide for reliable data links over large distances.

For a long haul network, data may be transmitted using protocols that enable the connection, communication and data transfer between computing end-points. For example, TCP/IP links allow applications to communicate reliably over IP packet networks. TCP/IP is a two-layer program. The higher layer, TCP, manages the assembling of a message or file into smaller packets that are transmitted over the Internet and received by a TCP layer that reassembles the packets into the original message. The lower layer, IP, handles the address part of each packet so that the packet is transmitted to the right destination. Each packet may include a checksum, which is a form of redundancy check in which data bits of the packet are added and the resulting value communicated to a receiver. If processing of the packet at a receiver detects an incorrect checksum, the receiver may conclude that the received packet contains errors and request that the transmitter retransmit the packet and/or may request that the transmitter retransmit from a certain byte offset in the stream.

TCP/IP links permit sharing of network bandwidth access connections using congestion-avoidance algorithms. One congestion-avoidance algorithm may be a window-adjustment algorithm that allows a TCP sender to dynamically adjust a transmission window that represents the maximum amount of unacknowledged data that may be in transit in the network at any given time. Window size may be calculated as bandwidth times the round trip delay or latency. In an acknowledgement scheme in which the receiver sends an acknowledge of received packets to the sender, it may take at least one roundtrip time for each packet to be acknowledged. Thus, a TCP sender can safely send up to a window's worth of packets every round trip time. In a long-haul network, the roundtrip time may be high, thereby yielding a reduced sending rate, which may drop even further if the window size is reduced or if dynamic adjustments to the window are made in a suboptimal fashion.

Congestion events may cause a significant reduction in the size of the transmission window. For example, in response to detection of congestion, TCP may cut the window size in half according to a window adjustment algorithm. Other technologies developed in connection with TCP window adjustment algorithms, include, for example, high speed TCP and variants thereof, which provide for the dynamic altering of how the window is opened on each round trip and closed on congestion events in a way that is dependent upon the absolute size of the window.

Long-haul TCP/IP links may be susceptible to packet loss and/or delay that may significantly reduce data transmission throughput. As discussed above, in the event of error detection using checksum, a receiver may request retransmission of a packet. However, in a long haul network, retransmission of packets may cause both latency and bandwidth issues resulting from long roundtrip times and decreased transmission window sizes. Accordingly, error correction techniques may be used to address these issues. Error correction may be performed using forward error correction (FEC) which is a system of error control for data transmission in which the sender adds redundant data to its messages, also known as an error correction code. FEC allows the receiver to detect and correct errors (to at least some extent) without the need to ask the sender for additional data. FEC involves adding redundancy to transmitted information using a predetermined algorithm. Each redundant bit may be a complex function of many original information bits. Two main categories of FEC are block coding and convolutional coding. Block codes work on packets of predetermined size. Convolutional codes work on data streams of arbitrary length. Convolutional codes may be decoded with the Viterbi algorithm, among other algorithms. Block codes may include, for example, Reed-Solomon, Golay, BCH and Hamming codes, among others. A convolutional code may be turned into a block code.

In FEC, a back-channel is not required and retransmission of data may often be avoided, which may be desirable in situations in which retransmission is costly and/or difficult. However, the cost of FEC may be higher bandwidth requirements to account for the transmission of the redundant data. In long haul TCP/IP links having a fixed transmission window size and relatively long round trip times, increased bandwidth requirements may significantly affect sending rates and data throughput. In addition, FEC algorithms that require both the sender and the receiver to be running the same algorithm lack flexibility.

Accordingly, it would be desirable to provide a system for error correction that provides for data reliability while improving data transmission throughput and may be used, for example, in connection with long-haul network communication, such as long-haul TCP/IP links. It would also be desirable if such a system provided flexibility to turn off and/or adjust the algorithm without having to always have the same algorithm running on all of the senders and receivers.

SUMMARY OF THE INVENTION

According to the system described herein, a method for error correction processing may include generating a correction packet at a transmitting device corresponding to a plurality of packets transmitted to a destination device. The correction packet may be transmitted to the destination device separately from the transmitting of the plurality of packets. The correction packet may be received at the destination device and it may be determined whether at least one of the plurality of packets transmitted to the destination device is a lost packet that has not been received at the destination device. If the lost packet of the plurality of packets transmitted is determined, rebuilding the lost packet using the correction packet. The correction packet may include XOR information of the plurality of packets. The plurality of packets may include at least one of: data packets and overhead information packets. The correction packet is transmitted to the destination device via a communications link that supports TCP/IP communication between the destination device and the transmitting device. The correction packet may be transmitted to the destination device using a different channel than a channel for transmission of the plurality of packets. A component at the transmitting device that generates the correction packet may have a similar configuration to a component at the destination device that rebuilds the lost packet. The method may further include determining connection conditions between the transmitting device and the destination device, and controlling generation of the correction packet according to the connection conditions.

According further to the system described herein, a computer-readable medium storing executable code for error correction processing may include at least one of: a first module and a second module. The first module may include executable code that generates a correction packet corresponding to a plurality of packets, and executable code that transmits the correction packet to a destination device separately from the transmitting of the plurality of packets. The second module may include executable code that receives the correction packet, executable code that determines whether at least one of the plurality of packets transmitted separately from the correction packet is a lost packet that has not been received; and executable code that, if the lost packet of the plurality of packets transmitted is determined, rebuilds the lost packet using the correction packet. The computer-readable medium may include both the first module and the second module. The correction packet may include XOR information of the plurality of packets. The plurality of packets may include at least one of: data packets and overhead information packets. The correction packet is transmitted to the destination device over a network via a communications link between the destination device and the transmitting device. The correction packet may be transmitted to the destination device using a different channel than a channel for transmission of the plurality of packets. A component at the transmitting device that generates the correction packet may have a similar configuration to a component at the destination device that rebuilds the lost packet. The computer-readable medium further include executable code that determines connection conditions between the transmitting device and the destination device, and executable code that controls generation of the correction packet according to the connection conditions.

According further to the system described herein, a system for error correction processing includes a device that is coupled to a network, the device including a processor and a computer-readable medium that executes executable code stored on the computer-readable medium, wherein the computer-readable medium includes at least one of: a first module and a second module. The first module may include executable code that generates a correction packet corresponding to a plurality of packets, and executable code that transmits the correction packet to a destination device separately from the transmitting of the plurality of packets. The second module may include executable code that receives the correction packet, executable code that determines whether at least one of the plurality of packets transmitted separately from the correction packet is a lost packet that has not been received, and executable code that, if the lost packet of the plurality of packets transmitted is determined, rebuilds the lost packet using the correction packet. The computer-readable medium of the device may include both the first module and the second module. The correction packet may be communicated using a different channel of a communications link than a channel for transmission of the plurality of packets. The device may be a first device, and the computer-readable medium of the first device may include the first module. A second device may be coupled to the first device via a communications link, wherein the second device includes the second module. The first device may further include executable code that determines connection conditions between the first device and the second device, and executable code that controls generation of the correction packet according to the connection conditions.

BRIEF DESCRIPTION OF THE DRAWINGS

Embodiments of the system described herein are explained in detail with reference to the several figures of the drawings, which are briefly described as follows.

DETAILED DESCRIPTION OF VARIOUS EMBODIMENTS

Referring now to the figures of the drawing, the figures comprise a part of this specification and illustrate exemplary embodiments of the described system. It is to be understood that in some instances various aspects of the system may be shown schematically or may be shown exaggerated or altered to facilitate an understanding of the system.

Figure 1:
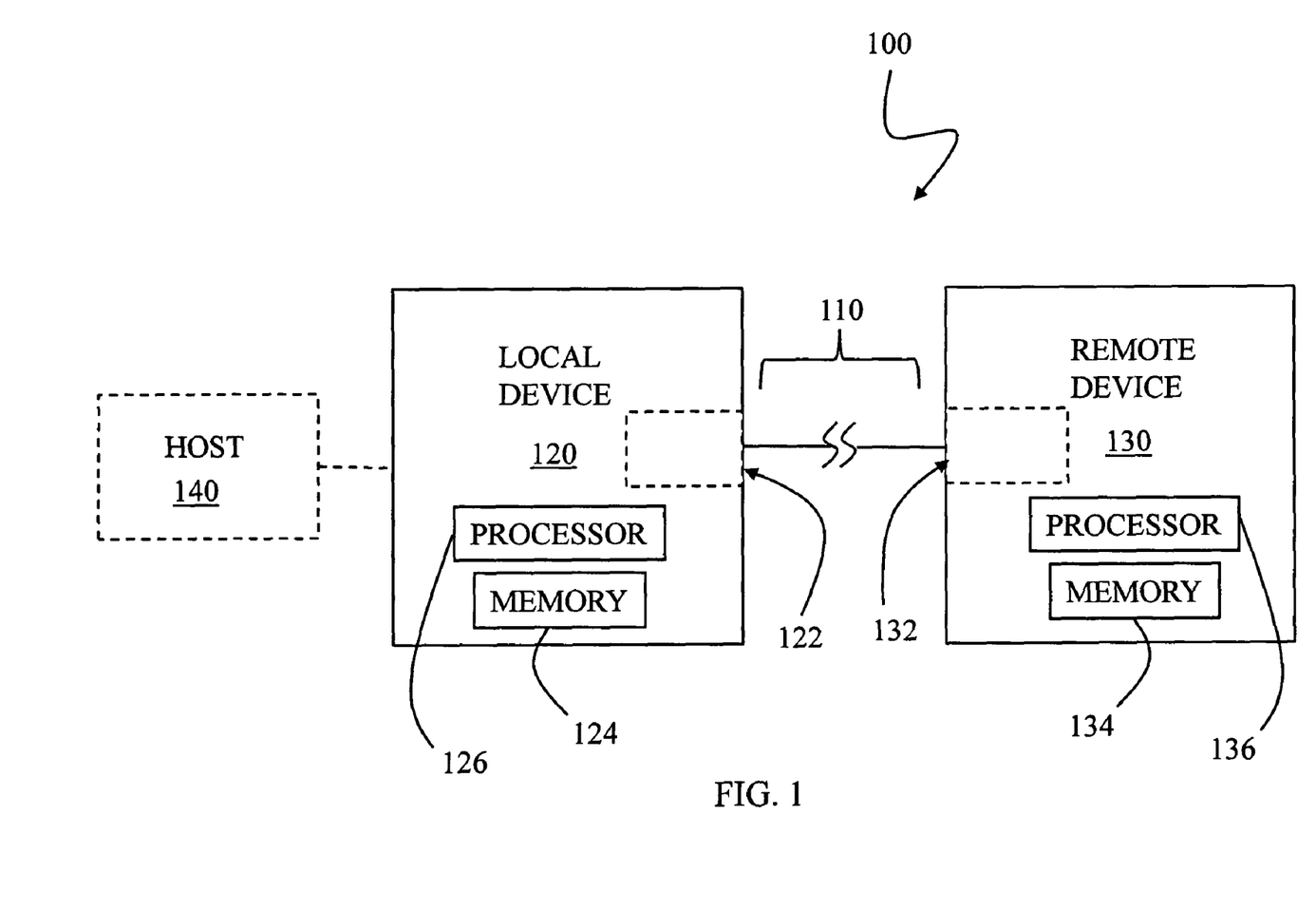
FIG. 1 is a schematic illustration showing a storage system including a local storage device coupled to a remote storage device via a link and which may be used in connection with the system described herein.

FIG. 1 is a schematic illustration showing a system 100 including a local device 120, coupled to a remote device 130 via a link 110 and which may be used in connection with the system described herein. The link 110 may be used in connection with multiple communication channels. In an embodiment, the link 110 may represent one or more TCP/IP links, including long-haul TCP/IP links, and may include a connection over a network, such as the Internet. Other appropriate types of communication links and transmission protocols may be used in connection with the system described herein. For example, wireless networks, fiber optic networks and corresponding transmission protocols may be used, among others. The local devices 120 and the remote device 130 may include hosts and/or one or more hosts 140 may be coupled to the local device 120 and/or to the remote device 130. The devices 120, 130 may each include a memory 124, 134 and one or more processors 126, 136, among other components, that may perform processes described herein including data receiving, transmitting, storing and/or error correction, as further discussed elsewhere herein. Each of the devices 120, 130 may include interconnects 122, 132 that represent components for the connection and interfacing of the devices 120, 130 to the link 110. The interconnects 122, 132 may include network sockets that interface the TCP/IP stack of the devices 120, 130. A network socket may include a protocol (e.g., TCP, User Datagram Protocol (UDP) and/or raw IP), a local IP address, a local port number, a remote IP address (for TCP sockets), and/or a remote port number (for TCP sockets). In an embodiment, the devices 120, 130 may operate as storage devices of an RDF product, such as provided by EMC Corporation of Hopkinton, Mass., for providing backup and/or mirroring of data. For further discussion of RDF and the use thereof in data communication and storage techniques, see U.S. Pat. No. 5,742,792 to Yanai, et al., which is incorporated herein by reference.

It should be noted that although the devices 120, 130 are shown in similar configurations, each of the devices 120, 130 may be of different types and/or configurations in connection with various types of devices for transmitting and receiving data packets according to the system described herein. In an embodiment, for example, only one of the devices 120, 130 may include components for an error correction algorithm according to the system described herein. Further, processes discussed in connection with one of the devices may also apply to the other of the devices, for example the device 120 as a transmitting device and the device 130 as a destination device and/or the device 120 as a destination device and the device 130 as a transmitting device. Moreover, the system described herein provides for transmission of error correction packets separately from transmission of data packets, allowing for use of side-band communication of the correction packet without requiring a change to application code using TCP for communication, for example, no changes to software above the TCP socket level.

One or more of the interconnects 122, 132 may include an interface layer including a software layer, stored on a memory such as one the memories 124, 134 and/or other computer-readable medium, that is disposed between the TCP/IP stack and device drivers. The software layer may send and receive packets over one or more networks via the link 110. The packets sent and received may include data packets, overhead information and/or correction packets for providing error correction, among other data and information. A correction packet may include an IP packet holding the XOR of N packets which may enable the rebuilding of the N packets in the event of data loss or corruption, as further discussed elsewhere herein. One and/or both of the devices 120, 130 may include components for generating a correction packet in connection with N packets and/or rebuilding a lost packet using a received correction packet, as further discussed elsewhere herein.

Figure 2:
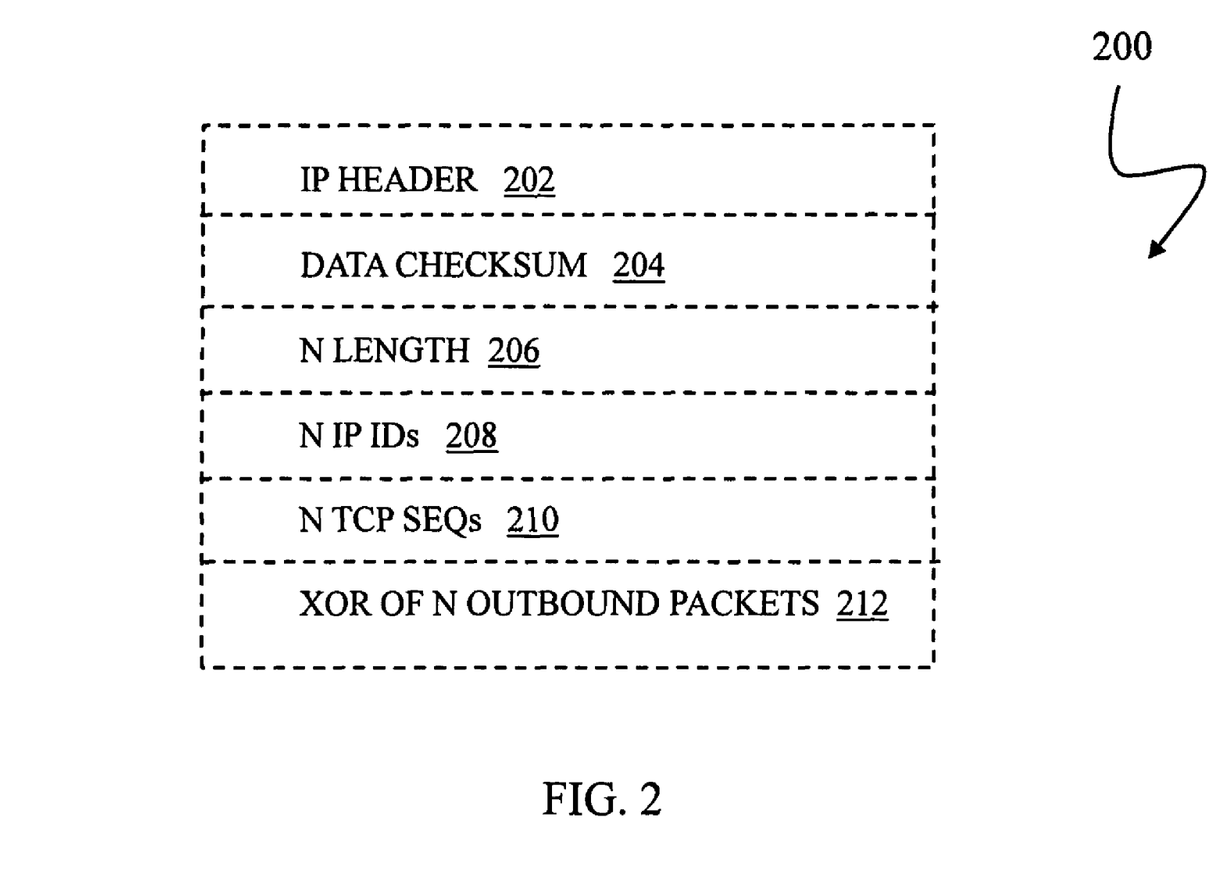
FIG. 2 is a schematic illustration of a format of a correction packet according to an embodiment of the system described herein.

FIG. 2 is a schematic illustration of a format of a correction packet 200 for error correction of N packets transmitted according to an embodiment of the system described herein. The correction packet 200 sent according to the system described herein may be an independent IP packet transmitted to a destination device and/or host, such as the device 130. Because the correction packet 200 may be an independent IP packet, the correction packet 200 may be transmitted separately from the N packets, for example, over a different channel and/or sideband. In an embodiment, the correction packet may be transmitted using a UDP channel separate from that used to transmit data over the TCP/IP link. In various other embodiments in which the link 110 may represent communication links other than TCP/IP links, the separate transmission of the correction packet may be performed using different transmission processes, including, for example using a different frequency.

The correction packet 200 may include information identifying the N packets to which the correction packet is applicable, as further discussed elsewhere herein. The correction packet may be transmitted separately from the N packets and/or over a different channel from the transmission of the N packets. Accordingly, even if a destination device, such as the device 130, is not configured and/or otherwise unable to process the correction packet 200 transmitted by the device 120, the N packets transmitted separately may still be received by the destination device. In such a case, for example, the correction packet 200 may be ignored by the destination device. Similarly, a transmitting device, such as the device 120, may not be configured and/or otherwise unable to generate a correction packet 200, while a destination device, such as the device 130, is configured for error correction processing according to the system described herein. In such a case, the destination device may still process received packets even if no correction packet is transmitted. The error correction algorithm may be turned on and off dynamically with substantially no impact on a network socket, such as a TCP/IP socket, as further discussed elsewhere herein. Note that the maximum transmission unit (MTU) of the TCP/IP links using the system described herein may be adjusted to account for packet group identification overhead.

The correction packet 200 may include one or more of the following information fields and/or blocks: an IP header 202, a data checksum value 204, length the N packets 206, IP IDs for each of the N packets 208, TCP sequences for each of the N packets 210, and the result of an XOR operation of the N packets 212. Other appropriate types of information may also be included in the correction packet 200 and some of the information blocks identified above may be combined and/or some of the information identified above may be further separated into additional blocks. In an embodiment, the correction packet 200 may be used in connection with recomputing a lost packet out of N packets transmitted according to the system described herein. It should also be noted that other types of error correction techniques, in addition to an XOR technique, may be used in connection with the system described herein, including error correction techniques that provide for the rebuilding of more than one lost packet. Note also that the XOR could be of the entire packet (data plus overhead) or possibly of just the payload (data) portion.

Figure 3:
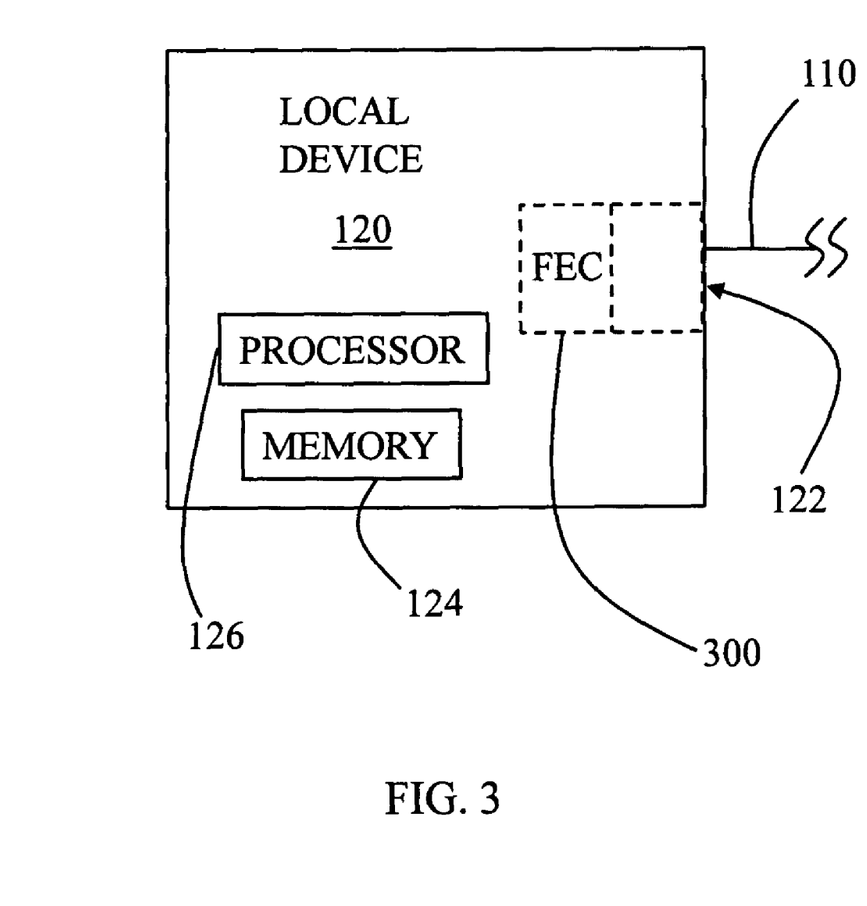
FIG. 3 is a schematic illustration showing the local device in which an FEC algorithm is included in an interface layer of the interconnect according to an embodiment of the system described herein.

FIG. 3 is a schematic illustration of the local device 120, including components discussed elsewhere herein, in which a forward error correction (FEC) algorithm for error correction processing using correction packets may be included as a software component 300 in an interface layer of the interconnect 122 according to an embodiment of the system described herein. The FEC algorithm may generate a correction packet, like the correction packet 200 (see FIG. 2), for error correction processing and/or may rebuild lost packets, such as lost IP packets, using a received correction packet 200, as further discussed elsewhere herein according to the system described herein.

In other embodiments, the FEC algorithm may be part of an FEC coding/decoding device that is software stored elsewhere on one or more of the devices 120, 130 and/or the FEC coding/decoding device may be a separate device coupled to one of more of the devices 120, 130. As further discussed elsewhere herein, FEC output and input processing may be turned on and off dynamically with substantially no impact on the network sockets since corrections packets may be independent IP packets sent to a destination device using a different channel.

Figure 4:
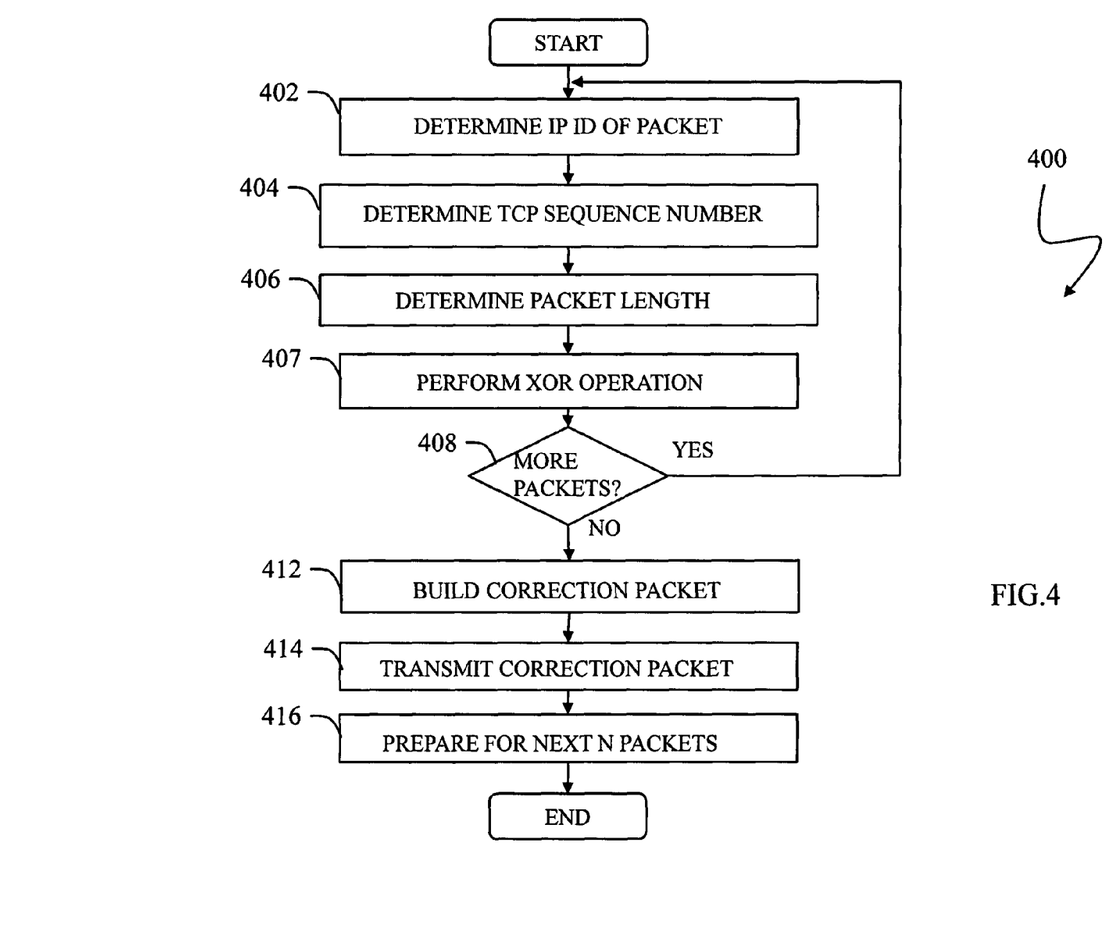
FIG. 4 is a flow diagram showing processing for an output of an FEC algorithm from a transmitting device according to an embodiment of the system described herein.

FIG. 4 is a flow diagram 400 showing processing for an output of an FEC algorithm from a transmitting device according to an embodiment of the system described herein. For example, in an embodiment, the flow diagram 400 may show FEC processing for correction packet generation with respect to transmission of IP packets from the device 120. The flow diagram 400 may be performed in connection with transmission of outgoing IP packets to a destination device. At a step 402, the IP ID is determined from the IP header of an outgoing packet. After the step 402, processing proceeds to a step 404 where the TCP sequence number is determined from the outgoing packet. After the step 404, processing proceeds to a step 406 where the length of the outgoing packet is determined. After the step 406, processing proceeds to a step 407 where an XOR operation is performed on the group of outgoing packets (N packets) to generate the XOR information block of the N packets 212 of the correction packet 200, as further described elsewhere herein. Additionally, and/or alternatively, other error correction techniques may be used to generate an error correction block that may be used like the XOR information block 212 discussed herein. After step 407, processing proceeds to a test step 408 where it is determined whether there are additional outgoing packets for transmission to the destination device. For example, the processing of the flow diagram 400 may be performed for every N packets. If there are additional outgoing packets to process, then processing proceeds back to the step 402. If not, then processing proceeds to a step 412 where the correction packet 200 is built and/or otherwise generated for the N packets according to the system described herein.

After the step 412, processing proceeds to a step 414 where the correction packet 200 is transmitted to the destination device (e.g., to a drive of the destination device) separately from the transmission of the N packets. The correction packet 200 may be transmitted on a different channel than a channel used for transmission of the N packets, as further discussed elsewhere herein. After the step 414, processing proceeds to a step 416 where the correction packet 200 may be removed from memory in the device 120 in preparation for the generation of a correction packet for the next group of N packets. Alternatively, the correction packet 200 may be stored, e.g., temporarily, and/or moved to a different memory location and/or may be subsequently transmitted again to the destination device, if needed or desired. After the step 416, processing is complete.

Figure 5:
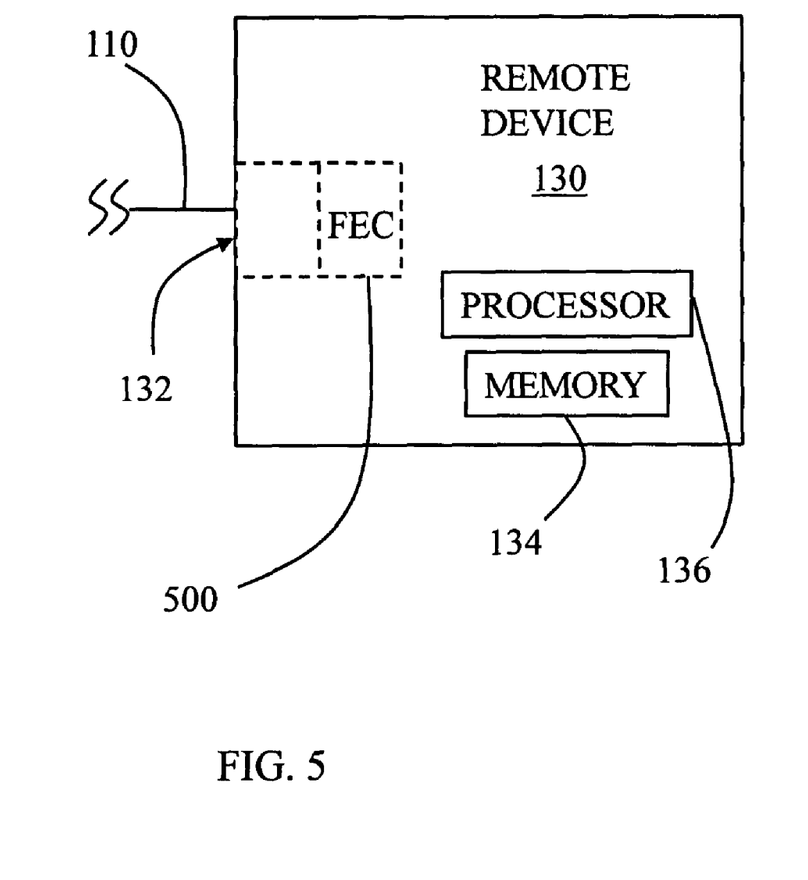
FIG. 5 is a schematic illustration showing the remote device in which an FEC algorithm is included in an interface layer of the interconnect according to an embodiment of the system described herein.

FIG. 5 is a schematic illustration of the local device 130, including components discussed elsewhere herein, including an FEC algorithm for error correction processing using correction packets shown as a software component 500 in an interface layer of the interconnect 132 according to an embodiment of the system described herein. The FEC algorithm may generate a correction packet, like the correction packet 200 (see FIG. 2), for error correction processing and/or may rebuild lost packets, such as lost IP packets, using a received correction packet, as further discussed elsewhere herein. The FEC algorithm may be part of an FEC coding/decoding device that is software stored elsewhere on one or more of the devices 120, 130 and/or the FEC coding/decoding device may be a separate device coupled to one or more of the devices 120, 130.

Figure 6:
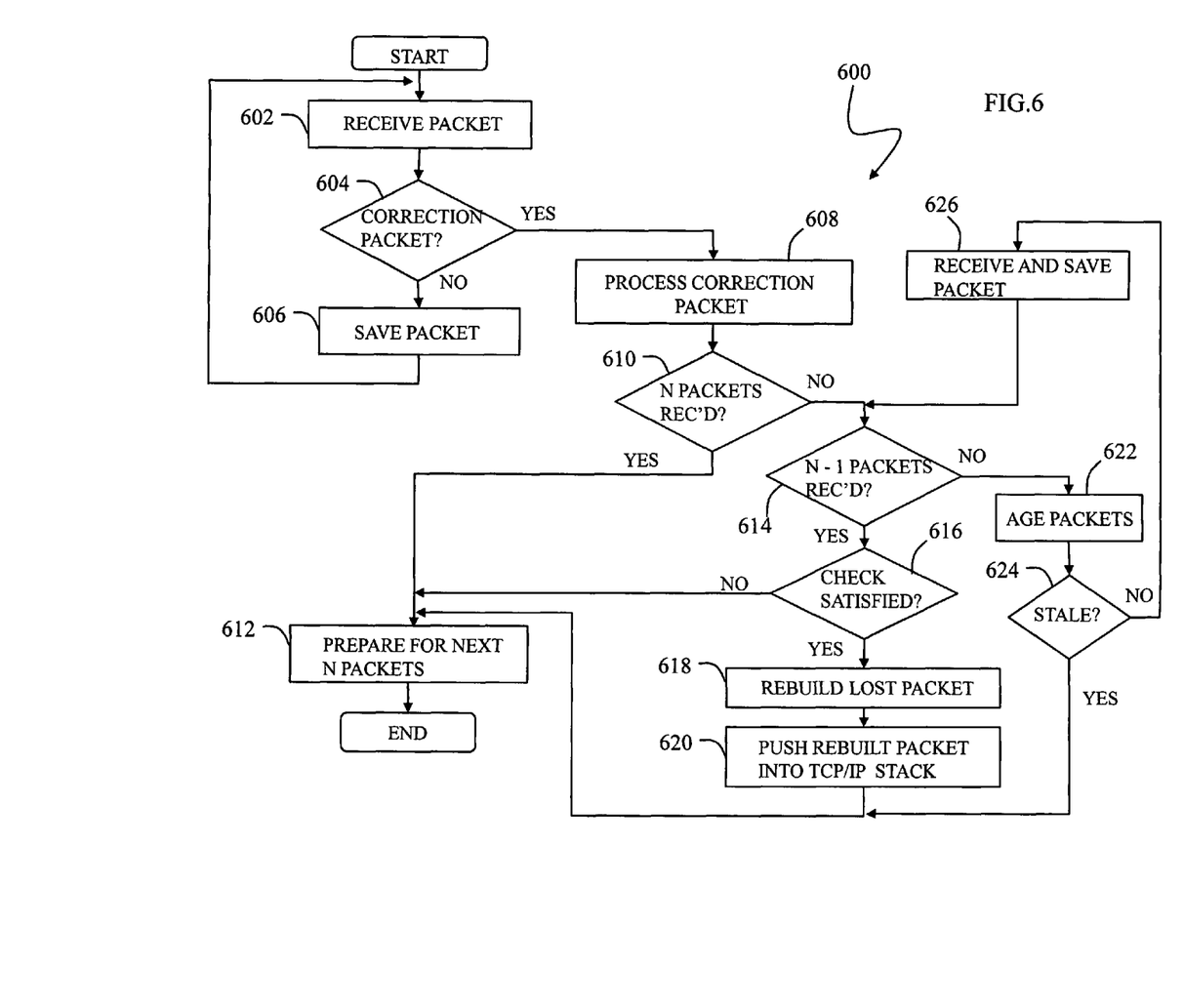
FIG. 6 is a flow diagram showing processing for an input of an FEC algorithm at a destination device according to an embodiment of the system described herein.

FIG. 6 is a flow diagram 600 showing processing for an input of an FEC algorithm at a destination device according to an embodiment of the system described herein. For example, in an embodiment, the flow diagram 600 may show FEC processing with respect to receipt of a correction packet 200 in connection with receipt of IP packets transmitted to the device 130 as a destination device. At a step 602, an IP packet, such as a TCP/IP packet is received at the destination device. After step 602, processing proceeds to a step 604 where it is determined if the packet is a correction packet. As further discussed elsewhere herein, a correction packet may be received over a different channel than a channel used to receive other packets. If the received packet is not a correction packet, then processing proceeds to a step 606, where the IP packet is saved. The saved IP packets and the correction packet may be used to recompute a lost packet, if one of out of the N packets is lost, as further discussed elsewhere herein. The IP packets may be saved in a hash table which may be hashed by IP ID. Hashing the IP packets by IP ID may allow for quick lookup of information when processing the correction packet 200 since the correction packet 200 holds all IP IDs of the group of N packets. If it is determined that there is already an entry in the hash table for the IP packet using a hash index, then a collision may be recorded (e.g., a collision flag set).

If at the test step 604, it is determined that the packet is a correction packet then processing proceeds to a step 608 where the correction packet is processed. Processing may include an indication that is made that the correction packet has been received, such as a field that may be established in the hash table that is set when a correction packet is received. After the step 608, processing proceeds to a test step 610 where it is determined whether all the N packets have been received. For example, such a determination may be made using the hash table to check if there is a collision of the packet IP IDs with the IP IDs stored in the correction packet. Processing collisions using the hash table may signal that an attempt to rebuild a lost packet at later processing may not be necessary. For example, the hash table collision processing may indicate that all N packets have already been received and error correction is not needed. It should be noted that the hashing algorithm may be suitably chosen such that a recorded collision may be a substantially definitive indication that all N packets have been successfully received. After the step 606, processing proceeds to the step 602, discussed above.

If processing at the test step 610 indicates that all N packets have been received, then no error correction may be required and processing proceeds to a step 612 where preparations are made for receiving the next N packets with error correction processing thereof. Processing in the step 612 may include, for example, a step of clearing the hash table entries and discarding any previously-received correction packets. After the step 612, processing is complete.

If at the test step 610, it is determined that all N packets have not been received, then processing proceeds to a test step 614 where it is determined if N−1 packets have been received. If so, then processing proceeds to a test step 616 where it is determined if a check indicates that the lost packet may be rebuilt. The check may include determining whether the hash table has matching IP IDs to the IP IDs of the correction packet, determining whether the hash table has matching TCP sequence numbers to the TCP sequence numbers in the correction packet, and/or other appropriate checks. If one or more of the above-noted checks fails, then the lost packet may not be safely rebuilt. Thus, if the check of the test step 616 is not satisfied, then processing proceeds to the step 612 where preparations are made for the next N packets, as further discussed elsewhere herein. If the check of the test step 616 is satisfied, indicating that the lost packet may be rebuilt, then processing proceeds to a step 618 where the lost packet is rebuilt. Rebuilding the lost packet may include performing an XOR operation with the N−1 packets and the XOR information field 212 for the correction packet 200 (see FIG. 2) containing the XOR result of the N outbound packets. Other processing may also be performed including recomputing the IP checksum, which may change as IP packets are passed through routers which may decrement time to live (TTL) in the IP header. After the step 618, processing proceeds to a step 620 where the rebuilt lost packet is pushed on to the TCP/IP stack of the destination device (e.g., the device 130). After the step 620 processing proceeds to the step 612 where preparations are made for the next N packets, as further discussed elsewhere herein.

If at the test step 614, it is determined that N−1 packets have not yet been received (e.g., fewer than N−1 packets have been received), then processing proceeds to a step 622 where the packet entries in the hash table are aged. Aging may be performed to ensure that the hash table is not polluted with stale packets. For example, such a scenario may occur if more than one packet has been lost and the system has been waiting for the packets. After the step 622, processing proceeds to a test step 624 where it is determined if the hash table entries are too stale, e.g., exceed a time threshold that is appropriately established. If the entries are determined to be too stale, then processing proceeds to the step 612, discussed above. If, on the other hand, it is determined at the test step 624 that the packets are not stale, then processing proceeds back to a step 626 where the next IP packet is received and saved (similar to the steps 602 and 606 discussed elsewhere herein). After the step 626, processing proceeds to back to the test step 614, discussed above.

It should also be noted that the step 612 may include processing that provides for discarding of a packet that is subsequently received after having been rebuilt, as a lost packet, according to the system described herein. That is, after the correction packets and N−1 packets have been received, the system described herein may provide for rebuilding the missing packet immediately, even if the missing packet turns out not to be a lost packet, but merely a packet subsequently received. The missing packet, once received, may be discarded according to appropriate processing at the step 612.

In various embodiments, aspects of the system discussed herein may controlled by user-settable configurations and/or by system self-setting configurations according to conditions. For example, the number of packets to which a correction packet may apply, the N packets, may be set by a user and/or may be set by the system according to the connection conditions between the transmitting device and the destination device, for example, according to bandwidth and/or round trip latency times. Accordingly, N may be raised and/or lowered depending on conditions and may vary over each set of N packets transmitted from the transmitting device to the destination device. The correction packet may indicate to the destination device that number of packets to which that correction packet applies, for example, using the N length field 206 discussed elsewhere herein. Note that decreasing N may improve error correction capability but may increase the amount of correction data that needs to be transmitted. Similarly, increasing N may reduce error correction capability but may decrease the amount of correction data that needs to be transmitted.

Figure 7:
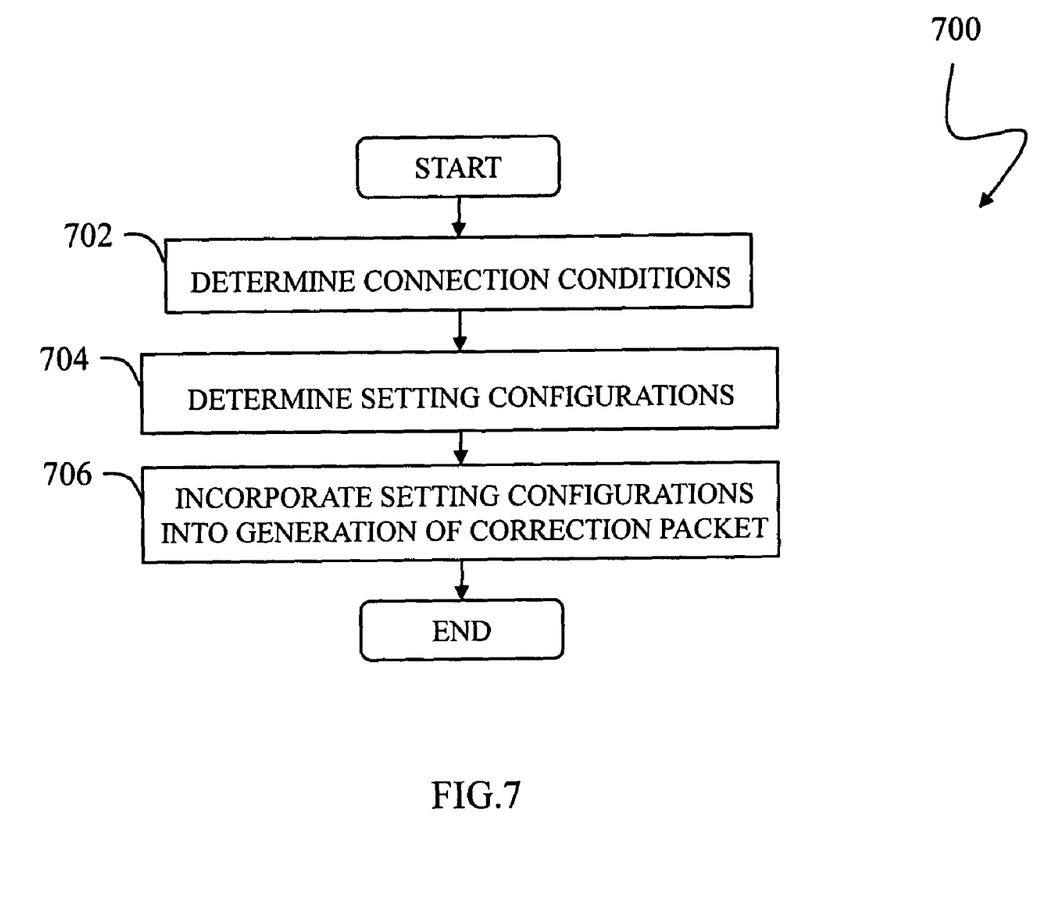
FIG. 7 is a flow diagram showing a process controlling setting configurations used in the generation of a correction packet based on connection conditions according to an embodiment of the system described herein.

FIG. 7 is a flow diagram 700 showing a process controlling setting configurations used in the generation of a correction packet based on connection conditions according to an embodiment of the system described herein. At a step 702, connection conditions are determined including type of link, bandwidth, round trip latency time and/or according to other conditions or criteria. The connection conditions may be determined by a user and/or or may be determined automatically in connection with the system described herein. In an embodiment, one or more of the FEC components 300, 500, as further discussed elsewhere here in connection with the devices 120, 130, may determine the conditions. After the step 702, processing proceeds to a step 704 where setting configurations are determined according to the determined conditions. In an embodiment, one or more of the FEC components 300, 500 may determine the setting configurations. For example, the number of packets N to which a correction packet is to apply may be determined. After the step 704, processing proceeds to a step 706 where the setting configurations determined may be used and/or otherwise incorporated into the generation process of the correction packet and included in the information in the correction packet that is transmitted to the destination device. After the step 706, processing is complete.

The system described herein may be used in connection with dynamic enabling algorithms that provide for enabling and disabling error correction processing according to characteristics of the link. For example, in an embodiment, an enabling algorithm may include two inputs: (1) a value for retransmission of data and/or other information, either total to destination or on a specific socket (to a specific destination), which may be termed f(R); and (2) a value for the bandwidth achieved to the destination which may be termed f(BW). When f(R)>x, and f(BW) is <y, then error correction processing may be enabled according to the system described herein. That is, if the value for retransmitting data (e.g., based on link conditions, size, difficulty, etc. . . . ) is high and the achieved bandwidth is low, then error correction under the system described herein may be enabled. Furthermore, when f(BW)>z, for z>y, then error correction may be disabled. In this case, only the input for f(BW) may be needed since a high achieved bandwidth may be a determinative factor providing for total retransmission of data regardless of f(R). The values of x, y and z may be configurable by a user and/or automatically set as further discussed elsewhere herein. Note that, for some embodiments, it is possible to only use bandwidth as a deciding parameter and just opportunistically enable error correction if there is available cpu.

The systems and processes discussed herein may be implemented on a computer-readable medium, such as a computer memory and/or portable hardware memory medium, on which is stored executable code that, when executed by at least one processor, performs one or more of the operations and/or processes discussed herein. The system described herein may be beneficial for code complexity and speed of execution.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method for error correction processing, comprising:
generating a correction packet at a transmitting device corresponding to a plurality of packets transmitted to a destination device;
transmitting the correction packet to the destination device separately from the transmitting of the plurality of packets;
receiving the correction packet at the destination device;

determining whether at least one of the plurality of packets transmitted to the destination device is a lost packet that has not been received at the destination device;
if the lost packet of the plurality of packets transmitted is determined, rebuilding the lost packet using the correction packet; and
dynamically determining whether to enable or disable the error correction processing based on an algorithm using a value for total retransmission of the plurality of packets without performing the error correction processing and a value for achieved bandwidth to the destination device.

2. The method according to claim 1, wherein the correction packet includes XOR information of the plurality of packets.

3. The method according to claim 1, wherein the plurality of packets include at least one of: data packets and overhead information packets.

4. The method according to claim 1, wherein the correction packet is transmitted to the destination device via a communications link that supports TCP/IP communication between the destination device and the transmitting device.

5. The method according to claim 1, wherein the correction packet is transmitted to the destination device using a different channel than a channel for transmission of the plurality of packets.

6. The method according to claim 1, wherein a component at the transmitting device that generates the correction packet has a similar configuration to a component at the destination device that rebuilds the lost packet.

7. The method according to claim 1, further comprising:
determining connection conditions between the transmitting device and the destination device; and
controlling generation of the correction packet according to the connection conditions.

8. The method according to claim 1, wherein, for f(R) being the value for total retransmission of the plurality of packets without performing the error correction processing and f(BW) being the value for achieved bandwidth to the destination device, the algorithm is:
when $f(R)>x$ and $f(BW)<y$, the error correction processing is enabled, and
when $f(BW)>z$, for $z>y$, the error correction processing is disabled.

9. The method according to claim 8, wherein x, y and z are automatically set according to connection conditions between the transmitting device and the destination device.

10. A non-transitory computer-readable medium storing executable code for error correction processing, the computer-readable medium comprising:
a first module and a second module;
wherein the first module includes:
executable code that generates a correction packet corresponding to a plurality of packets; and
executable code that transmits the correction packet to a destination device separately from the transmitting of the plurality of packets;
and wherein the second module includes:
executable code that receives the correction packet;
executable code that determines whether at least one of the plurality of packets transmitted separately from the correction packet is a lost packet that has not been received; and
executable code that, if the lost packet of the plurality of packets transmitted is determined, rebuilds the lost packet using the correction packet; and
wherein at least one of: the first module or the second module includes executable code that dynamically determines whether to enable or disable the error correction processing based on an algorithm using a value for total retransmission of the plurality of packets without performing the error correction processing and a value for achieved bandwidth to the destination device.

11. The computer-readable medium according to claim 10, wherein the correction packet includes XOR information of the plurality of packets.

12. The computer-readable medium according to claim 10, wherein the plurality of packets include at least one of data packets and overhead information packets.

13. The computer-readable medium according to claim 10, wherein the correction packet is communicated using a different channel of a communications link than a channel for transmission of the plurality of packets.

14. The computer-readable medium according to claim 10, wherein the executable code that generates the correction packet is part of a first error correction component that is similar to a second error correction component that includes the executable code that rebuilds the lost packet.

15. The computer-readable medium according to claim 10, further comprising:
executable code that determines connection conditions between a transmitting device and a destination device; and
executable code that controls generation of the correction packet according to the connection conditions.

16. The computer readable medium according to claim 10, wherein, for f(R) being the value for total retransmission of the plurality of packets without performing the error correction processing and f(BW) being the value for achieved bandwidth to the destination device, the algorithm is:
when $f(R)>x$ and $f(BW)<y$, the error correction processing is enabled, and
when $f(BW)>z$, for $z>y$, the error correction processing is disabled.

17. The computer readable medium according to claim 16, wherein x, y and z are automatically set according to connection conditions between the transmitting device and the destination device.

18. A system for error correction processing, comprising:
a transmission device and a destination device that are coupled to a network, the transmission device and the destination device each including a processor and a computer-readable medium that executes executable code stored on the computer-readable medium, wherein the computer-readable medium of the transmission device includes a first module, wherein the first module includes:
executable code that generates a correction packet corresponding to a plurality of packets; and
executable code that transmits the correction packet to the destination device separately from the transmitting of the plurality of packets;
and wherein the computer readable medium of the destination device includes a second module, wherein the second module includes:
executable code that receives the correction packet;
executable code that determines whether at least one of the plurality of packets transmitted separately from the correction packet is a lost packet that has not been received; and
executable code that, if the lost packet of the plurality of packets transmitted is determined, rebuilds the lost packet using the correction packet; and
wherein at least one of the first module or the second module further includes:

executable code that dynamically determines whether to enable or disable the error correction processing based on an algorithm using a value for total retransmission of the plurality of packets without performing the error correction processing and a value for achieved bandwidth to the destination device.

19. The system according to claim 18, wherein the correction packet is communicated using a different channel of a communications link than a channel for transmission of the plurality of packets.

20. The system according to claim 18, wherein at least one of the transmission device or the destination device further comprises:
    executable code that determines connection conditions between the transmission device and the destination device; and
    executable code that controls generation of the correction packet according to the connection conditions.

21. The system according to claim 18, wherein, for f(R) being the value for total retransmission of the plurality of packets without performing the error correction processing and f(BW) being the value for achieved bandwidth to the destination device, the algorithm is:
    when f(R)>x and f(BW)<y, the error correction processing is enabled, and
    when f(BW)>z, for z>y, the error correction processing is disabled.

22. The system according to claim 21, wherein x, y and z are automatically set according to connection conditions between the transmitting device and the destination device.

\* \* \* \* \*